United States Patent [19]

Coico et al.

[11] Patent Number: 5,723,905
[45] Date of Patent: Mar. 3, 1998

[54] SEMICONDUCTOR PACKAGE WITH LOW STRAIN SEAL

[75] Inventors: Patrick Anthony Coico, Fishkill; David Linn Edwards, Poughkeepsie; Shaji Farooq; Raed A. Sherif, both of Hopewell Junction; Hilton T. Toy, Wappingers Falls, all of N.Y.

[73] Assignee: International Business Machines Corporation, Armonk, N.Y.

[21] Appl. No.: 511,175

[22] Filed: Aug. 4, 1995

[51] Int. Cl.$^6$ ..................................... H01L 23/12
[52] U.S. Cl. .................... 257/704; 257/710; 257/729
[58] Field of Search ........................... 257/704, 710, 257/747, 729; 437/215, 218, 221, 224

[56] References Cited

U.S. PATENT DOCUMENTS

| | | | |
|---|---|---|---|
| 4,656,499 | 4/1987 | Butt | 357/74 |
| 4,680,618 | 7/1987 | Kuroda et al. | 357/74 |
| 4,729,010 | 3/1988 | Tsuchiya et al. | 257/747 |
| 5,052,481 | 10/1991 | Horvath et al. | 165/185 |
| 5,086,333 | 2/1992 | Osada et al. | 357/67 |
| 5,099,310 | 3/1992 | Osada et al. | 357/81 |
| 5,100,740 | 3/1992 | Neugebauer et al. | 428/622 |
| 5,103,292 | 4/1992 | Mahulikar | 357/74 |
| 5,168,344 | 12/1992 | Ehlert et al. | 257/693 |
| 5,188,280 | 2/1993 | Nakao et al. | 228/123 |

FOREIGN PATENT DOCUMENTS

| | | | |
|---|---|---|---|
| 58-96757 | 6/1983 | Japan | 257/747 |

*Primary Examiner*—Mahshid D. Saadat
*Assistant Examiner*—S. V. Clark
*Attorney, Agent, or Firm*—Dale M. Crockatt

[57] ABSTRACT

A semi-conductor packaging structure and a method to reduce the seal strain of the package are disclosed. The structure comprises a cap, substrate, seal and the cap and substrate have a predetermined TCE mismatch. The TCE mismatch between the cap and substrate is predetermined to minimize the seal strain during power-on and power-off use conditions. Preferably, the device has a substrate comprises a ceramic material, a cap with a thermal conductivity of at least about 100 W/m-K. A method of selecting a cap material is disclosed.

2 Claims, No Drawings

000
SEMICONDUCTOR PACKAGE WITH LOW STRAIN SEAL

BACKGROUND OF THE INVENTION

1. Field of the Invention

The present invention relates generally to packaging components for semi-conductor devices and methods for the manufacture thereof, and more particularly to a package comprising a cap and substrate and having a mismatch in the coefficients of thermal expansion between the cap and substrate.

2. Brief Description of Related Art

In a semi-conductor chip package design, consideration must be given to heat removal from the package as well as to protecting devices in the package from the environment. Generally, in a semi-conductor chip package there is at least one semi-conductor chip, and a package component that acts as a heat sink to prevent overheating and possible resulting failure of the semi-conductor chips. In a number of designs the semi-conductor chip package heat dissipation path includes a cap that covers the semi-conductor chips. The cap must be attached to the package in some manner, and the cap is usually sealed to the substrate to protect the device and substrate metallurgy from the environment. In higher power applications, heat sinks may be attached to the back of the cap, or the cap and heat sink can be combined into a common structure.

The method of sealing the cap to the substrate varies and may be done by various means known to those experienced in the art. The seal between the cap and substrate must be flexible since the substrate and cap heat and expand in use. If the cap and substrate are of different materials or have different heating rates, that is if the different materials have different thermal coefficients of expansion (TCE), then there can be strain on the seal as heating and cooling occur. If the strain on the seal is above a threshold value then the seal will fatigue and will eventually fail. For that reason, systems having a TCE match between the cap and substrate, or systems using c-rings and seal frames if there is a TCE mismatch, have been favored for hermetic applications. Compliant adhesives have been used for large TCE mismatches for non-hermetic applications. The following references illustrate the state of the pertinent art.

U.S. Pat. No. 5,052,481 describes a system that uses high conductivity materials in a large water cooled module where a cap has finned interconnecting devices to link it thermally with the back of the chips. A hermetic seal is obtained through the use of a C-ring.

U.S. Pat. No. 5,188,280 describes a method of bonding metals and an apparatus for bonding metals which include irradiating the metals with an atomic beam and pressing the metals together in an inert gas atmosphere.

U.S. Pat. No. 5,100,740 describes a bonding method requiring that the TCE of the cap and substrate be matched. The cap comprises a symmetric, three layered structure where each layer is an isomorphic metal. The cap is either a Cu—W—Cu or Cu—Mo—Cu structure.

U.S. Pat. No. 4,656,499 describes a system that uses two solder seals to create a hermetic package. The seal is made up of two components; a seal frame is soldered to the substrate and a cap is soldered to the seal frame. The cap may be made from a material with a high thermal conductivity but both the seal frame and cap must be selected from materials that closely match the TCE of the substrate.

U.S. Pat. No. 5,168,344 describes a module that uses a seal frame with a TCE similar to that of the substrate to create a TCE match in a system that would otherwise have a TCE mismatch between the high thermal conductivity cap made of copper or aluminum and the substrate.

U.S. Pat. No. 5,103,292 describes modules where a metal cap of any metal or alloy is joined by means of an epoxy to a substrate of the same or different material. This requires the TCE of the frame and cap to be similar.

U.S. Pat. No. 5,086,333 describes a system comprising a substrate formed by infiltrating molten copper into a sintered compound of tungsten or molybdenum.

U.S. Pat. No. 5,099,310 describes a TCE system comprising a substrate formed by infiltrating molten copper into a pressed and sintered compound of tungsten and/or molybdenum and an enclosure base unit formed from $Al_2O_3$.

U.S. Pat. No. 4,680,618 describes a TCE system which uses a ceramic substrate and a cap formed by impregnating molten copper with porous tungsten or molybdenum.

Low cost hermetic sealing methods and structures for semi-conductor packages are advantageous. However, known methods for producing low cost hermetically sealed semi-conductor packages require a TCE match between the cap and substrate. Other available methods of hermetically sealing high performance semi-conductor packages require additional system hardware.

There are numerous disadvantages that have been traditionally associated with TCE mismatched component sealing; among those disadvantages are lost space on the substrate, additional hardware or tooling, and increased production time. Traditional low cost hermetic seal forming materials such as solder, and certain low cost non-hermetic seal forming materials such as epoxy, require the TCE of the cap be similar to the TCE of the substrate, meaning that the cap and substrate heat and expand at the same rate. If there is a TCE mismatch in the system, which results in differing rates and amounts of expansion, then additional hardware in the form of c-rings or seal frames may be necessary if hermeticity was sought.

Thus, there is a need for a system which provides low cost sealing methods and TCE mismatched component parts which accommodate non-isothermal packages and the mechanical requirements of the seal.

SUMMARY OF THE INVENTION

It is an object of the present invention to establish a controlled TCE mismatch between the cap and substrate of a semiconductor device package which reduces the strain on a seal in the semi-conductor package.

It is another object of this invention to create a TCE mismatch which matches the component thermal expansion of the cap and substrate which reduces the strain on the seal between the cap and substrate.

Further objects and features of the present invention will be apparent from the following specification and claims.

Thus, according to the invention, a novel semiconductor package is provided. The semiconductor package comprises a substrate having at least one semiconductor device thereon, a cap covering the at least one semiconductor device on said substrate and a seal between said cap and said substrate wherein said cap has a predetermined TCE mismatch with said substrate. This reduces the strain on the seal in the semi-conductor package.

DETAILED DESCRIPTION OF THE PREFERRED EMBODIMENTS

The present invention provides novel components which produce improved semiconductor packages. A typical package comprises a seal, a cap and a substrate where the cap and substrate are selected to obtain a precalculated difference in TCE between the cap and substrate, that is, a thermal coefficient of expansion (TCE) mismatch. The invention is particularly useful for high performance packages requiring a hermetic seal. Additionally, the invention is particularly useful in reducing fatigue failure in non-isothermal cycling. By non-isothermal cycling is meant different amounts of component heating as a result of electrical power cycling of the system.

The substrate material must be capable of forming a seal. When selecting a cap material, TCE is of primary importance. Thermal conductivity is often a strong secondary consideration. Examples of substrate material include AlN, Mo—Cu, Copper clad Invar, glass ceramic or alumina. In a preferred embodiment, the substrate may comprise a ceramic material. In a more preferred embodiment the substrate may comprise 9211 glass ceramic or sintered alumina.

The cap is preferably a material which provides a means for enclosing at least one semiconductor chip. The cap material must be chemically friendly and capable of being sealed. Examples include silver, copper, graphite, aluminum, tungsten, molybdenum, silicon, W—Cu, Si—C, Al—Si—C, AlN, Silvar(TM), and Mo—Cu. In a preferred embodiment the thermal conductivity of the cap material is greater than about 40 W/m-K. In a more preferred embodiment the thermal conductivity of the cap material is greater than about 100 W/m-K. In an alternate preferred embodiment the cap material would comprise W—Cu, Al—Si—C, AlN, Silvar(TM) or Mo—Cu. The present invention contemplates structures comprising materials which are not layered, single phase, or isomorphic. Examples of materials which do not have to be layered include compounds made by a powder metallurgy process. Additionally, the preferred embodiment of the present invention provides that the TCE of the cap is greater than that of the substrate. In a more preferred embodiment, the TCE of the cap is greater than the TCE of the substrate by about 5% of the substrate TCE. In an even more preferred embodiment the TCE of the cap is greater than the TCE of the substrate by about 5–60% of the substrate TCE. In a most preferred embodiment the TCE of the cap is greater than the TCE of the substrate by about 20%–30% of the substrate TCE. Although the disclosure describes an invention where the TCE of the cap is higher than the TCE of the substrate, those skilled in the art will appreciate that the TCE of the substrate may be higher than the TCE of the cap.

The seal consists of a material capable of adhering to both the cap and substrate. The seal includes materials known in the art. Examples of sealing materials are solder and epoxy. In a preferred embodiment the seal material is solder. In another preferred embodiment the seal is hermetic.

The mean thermal coefficient of expansion (TCE) over a given range of temperatures is defined as the expansion per unit length over the temperature range divided by the temperature range. When two different components are bound together, the difference in the individual compound TCEs is called the TCE mismatch.

Strain in a seal between two components may originate from expansion differences between components, measured at the locus of sealing. The strain may result from a combination of TCE differences, temperature differences between the cap and substrate and temperature gradients between the cap and substrate. Temperature gradient is the absolute value of the range of temperatures within the structure at thermal equilibrium. Most often, a TCE match is desired when the components are close temperature matched in both the transient and steady states. However, when component temperatures are different or when temperature gradients exist, an intentional TCE mismatch rather than a TCE match can reduce the strain on the seal.

It is an important characteristic of this invention to determine exactly what percentage of TCE mismatch is desired between a given cap and substrate. Furthermore, a material for the cap can be selected to achieve the desired TCE mismatch.

As a practical matter any system will fail eventually; therefore the calculation of strain is appropriate only for a certain range of time and under certain conditions. The relevant time should preferably be longer than the projected life of the package.

Strain often occurs when a chip is powering on and off and also when it is in steady state. All maximum strain values occurring in one cycle should be considered. The cumulative fatigue that occurs from transient and steady state cycling can be calculated. $N_{fx}$ is a global measure of the cumulative fatigue, where x represents the percentage of seals that will fail at a given $N_f$. The $N_f$ at any maximum value is proportional to the reciprocal of the strain raised to the mth power; where m is greater than one. The reciprocal of global $N_{fx}$ is equal to the sum of the reciprocals of each local $N_f$ at each maximum.

The strain at each maximum can be calculated using a thermomechanical model. Use of a model is necessary because the components are neither isothermal nor of similar size and shape. The value obtained from the thermomechanical model can be substituted into the relationship described above.

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A semiconductor package comprising:

a substrate having at least one semiconductor device thereon;

a cap covering the at least one semiconductor device on said substrate; and a seal between said cap and said substrate;

wherein said cap has a predetermined TCE mismatch with said substrate, and wherein said mismatch is determined by a minimal solution for the cap TCE, given the substrate TCE, according to the formula:

$$M = \alpha_{cap} \times \Delta T_{cap} - \alpha_{sub} \times \Delta T_{sub} \qquad (I)$$

where M is the absolute value of the difference between the normalized rates of expansion between the cap and the substrate, $\alpha_{cap}$ is the TCE of the cap, $\Delta T_{cap}$ is the temperature change over time of the cap from power-on until thermal equilibrium, $\alpha_{sub}$ is the TCE of the substrate and $\Delta T_{sub}$ is the temperature change over time of the substrate from power-on until thermal equilibrium.

2. A method of making a semi-conductor package comprising the steps of:

a. obtaining a substrate having at least one semiconductor device thereon;

b. obtaining a cap characterized by having a TCE which has a value that is a minimal solution of the equation:

$$M = \alpha_{cap} \times \Delta T_{cap} - \alpha_{sub} \times \Delta T_{sub} \tag{III}$$

wherein M is the absolute value of the difference between the normalized rates of expansion between the cap and the substrate, $\alpha_{cap}$ is the TCE of the cap, $\Delta T_{cap}$ is the temperature change of the cap from power-on until thermal equilibrium, $\alpha_{sub}$ is the TCE of the substrate and $\Delta T_{sub}$ is the temperature change of the substrate from power-on until thermal equilibrium; and c. assembling said substrate and said cap with said sealant to form the semiconductor device package.

* * * * *